(12) United States Patent
Goshi

(10) Patent No.: US 12,142,474 B2
(45) Date of Patent: Nov. 12, 2024

(54) SUBSTRATE PROCESSING METHOD AND SUBSTRATE PROCESSING SYSTEM

(71) Applicant: Tokyo Electron Limited, Tokyo (JP)

(72) Inventor: Gentaro Goshi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 14 days.

(21) Appl. No.: 18/181,020

(22) Filed: Mar. 9, 2023

(65) Prior Publication Data
US 2023/0290632 A1   Sep. 14, 2023

(30) Foreign Application Priority Data

Mar. 10, 2022 (JP) ................................. 2022-037537
Nov. 15, 2022 (JP) ................................. 2022-182765

(51) Int. Cl.
*H01L 21/02* (2006.01)
*H01L 21/67* (2006.01)

(52) U.S. Cl.
CPC .... *H01L 21/0206* (2013.01); *H01L 21/67034* (2013.01); *H01L 21/67051* (2013.01)

(58) Field of Classification Search
CPC ........... H01L 21/0206; H01L 21/67034; H01L 21/67051; H01L 21/02057; H01L 21/02101; H01L 21/67017; H01L 21/67028; H01L 21/67109
See application file for complete search history.

(56) References Cited

U.S. PATENT DOCUMENTS

| | | | |
|---|---|---|---|
| 9,583,330 B2* | 2/2017 | Ji | F26B 21/14 |
| 2014/0144462 A1* | 5/2014 | Verhaverbeke | H01L 21/67109 134/1.2 |
| 2019/0355574 A1* | 11/2019 | Kanno | H01L 21/67028 |

FOREIGN PATENT DOCUMENTS

| | | | |
|---|---|---|---|
| JP | 2019-033246 A | | 2/2019 |
| KR | 20160147162 A | * | 12/2016 |

OTHER PUBLICATIONS

Machine translation of KR2016-0147162A (Year: 2016).*

* cited by examiner

*Primary Examiner* — Douglas Lee
(74) *Attorney, Agent, or Firm* — Pearne & Gordon LLP

(57) ABSTRACT

A substrate processing method includes removing a dissolved gas in a processing liquid; forming a liquid film of the processing liquid covering a surface of a substrate, by supplying, onto the surface of the substrate, the processing liquid from which the dissolved gas is removed; carrying the substrate having the liquid film formed thereon into a processing vessel; and drying the surface of the substrate by flowing a processing fluid into the processing vessel while maintaining an internal pressure of the processing vessel, in which the substrate having the liquid film formed thereon is accommodated, at a pressure allowing the processing fluid to be maintained in a supercritical state, to replace the processing liquid covering the surface of the substrate with the processing fluid, and, then, by vaporizing the processing fluid.

13 Claims, 5 Drawing Sheets

SUBSTRATE PROCESSING METHOD AND SUBSTRATE PROCESSING SYSTEM

CROSS-REFERENCE TO RELATED APPLICATION

This application claims the benefit of Japanese Patent Application Nos. 2022-037537 and 2022-182765 filed on Mar. 10, 2022, and Nov. 15, 2022, respectively, the entire disclosures of which are incorporated herein by reference.

TECHNICAL FIELD

The various aspects and embodiments described herein pertain generally to a substrate processing method and a substrate processing system.

BACKGROUND

In a semiconductor device manufacturing process in which a stacked structure of integrated circuits is formed on a surface of a semiconductor wafer (hereinafter, simply referred to as a wafer) as a substrate, a treatment process of treating the surface of the wafer with a liquid is performed. For example, a minute particle or a natural oxide film on the surface of the wafer is removed with a cleaning liquid such as a chemical liquid.

To remove the liquid remaining on the surface of the wafer in this treatment process, there is known a method of using a processing fluid in a supercritical state. For example, Patent Document 1 discloses a substrate processing apparatus configured to dry the wafer by dissolving an organic solvent from above the substrate through the use of the supercritical fluid.

In the substrate processing apparatus of Patent Document 1, the surface of the wafer is cleaned by a cleaning liquid such as a chemical liquid within a cleaning apparatus. On the surface of the wafer after being cleaned, there is accumulated an organic solvent as a processing liquid. The wafer on which the organic solvent is accumulated is transferred from the cleaning apparatus to a supercritical processing apparatus, and a drying processing for the wafer is performed within the supercritical processing apparatus by using a processing fluid in a supercritical state. By accumulating the organic solvent on the surface of the wafer in this way, the surface of the wafer after being cleaned is suppressed from being dried until it is dried in the supercritical processing apparatus, so that particle generation is suppressed.

Patent Document 1: Japanese Patent Laid-open Publication No. 2019-033246

SUMMARY

In one exemplary embodiment, a substrate processing method includes removing a dissolved gas in a processing liquid; forming a liquid film of the processing liquid covering a surface of a substrate, by supplying, onto the surface of the substrate, the processing liquid from which the dissolved gas is removed; carrying the substrate having the liquid film formed thereon into a processing vessel; and drying the surface of the substrate by flowing a processing fluid into the processing vessel while maintaining an internal pressure of the processing vessel, in which the substrate having the liquid film formed thereon is accommodated, at a pressure allowing the processing fluid to be maintained in a supercritical state, to replace the processing liquid covering the surface of the substrate with the processing fluid, and, then, by vaporizing the processing fluid.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
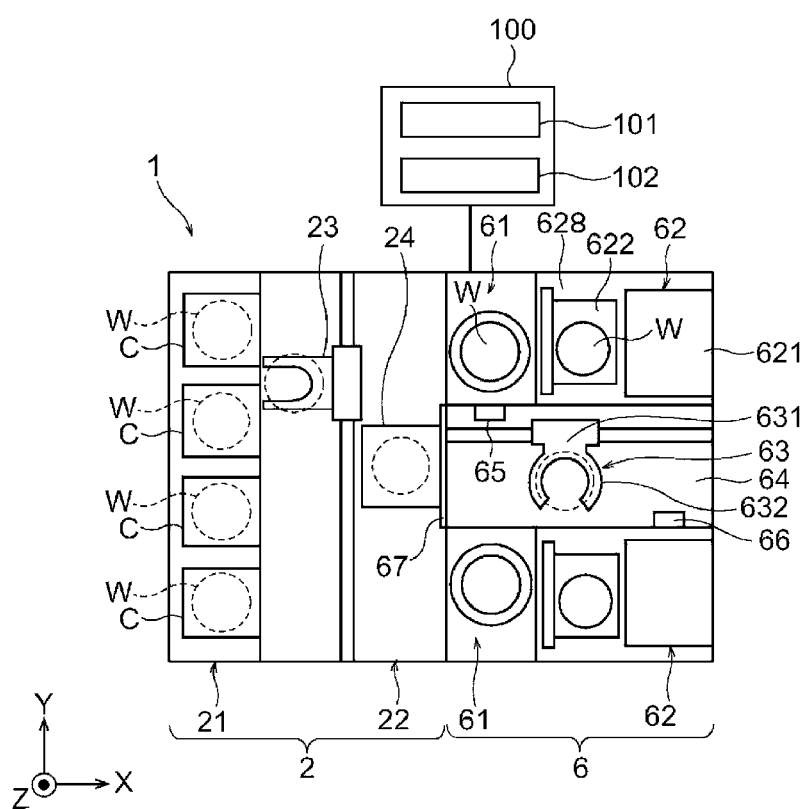
FIG. 1 is a schematic transversal sectional view of a substrate processing system according to an exemplary embodiment of a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing system 1 according to an exemplary embodiment of a substrate processing apparatus of the present disclosure will be described with reference to the accompanying drawings. In order to simplify description of directions, an XYZ rectangular coordinate system is set and displayed in the lower left of FIG. 1. The Z direction is a vertical direction, and the positive Z direction is an upward direction.

As shown in FIG. 1, the substrate processing system 1 is equipped with a control device 100. The control device 100 is implemented by a computer, and includes an operation unit 101 and a storage unit 102. The storage unit 102 stores therein a program (including processing recipes) for controlling various processings performed in the substrate processing system 1. The operation unit 101 reads out and executes the program stored in the storage unit 102 to control the operations of individual components of the substrate processing system 1 to be described later to implement a series of processes to be described later. The control device 100 may be equipped with a user interface such as a keyboard, a touch panel, or a display. The aforementioned program may be recorded in a computer-readable recording medium and installed from this recording medium into the storage unit 102 of the control device 100. The computer-readable recording medium may be, by way of non-limiting example, a hard disk (HD), a flexible disk (FD), a compact disk (CD), a magnet optical disk (MO), a memory card, or the like.

The substrate processing system 1 includes a carry-in/out section (carry-in/out station) 2 and a processing section (processing station) 6.

The carry-in/out section 2 is equipped with a container placement section 21 and a first transfer section 22. A plurality of substrate transfer containers C (for example, FOUPs) can be placed in the container placement section 21. In each substrate transfer container C, a multiple number of substrates W (for example, semiconductor wafers) are horizontally accommodated at an interval therebetween in a vertical direction.

The first transfer section 22 is provided adjacent to the container placement section 21. Provided inside the first transfer section 22 are a first substrate transfer robot (first substrate transfer mechanism) 23 and a delivery unit (delivery module) 24. The first substrate transfer robot 23 is equipped with a substrate holding mechanism as an end effector configured to hold the substrate W. The first substrate transfer robot 23 is configured to be movable in a horizontal and a vertical direction and pivotable around a vertical axis. The first substrate transfer robot 23 transfers the substrate W between the delivery unit 24 and the substrate transfer container C on the container placement section 21.

The processing section 6 is provided adjacent to the first transfer section 22. The processing section 6 includes one or more single-wafer type liquid processing units 61, one or more supercritical drying units 62 configured to perform supercritical drying of the substrate W processed in the single-wafer type liquid processing unit 61, and a second substrate transfer robot (second substrate transfer mechanism) 63. In one exemplary embodiment, a plurality of single-wafer type liquid processing units 61 and a plurality of supercritical drying units 62 may be vertically stacked at positions shown in FIG. 1.

The second substrate transfer robot 63 is equipped with, for example, an end effector configured to be moved by a multi-axis driving mechanism 631 that is movable in the X and Y directions, movable up and down in the Z direction, and pivotable around a vertical axis. The end effector is, for example, a fork-shaped substrate holder 632 capable of holding a single sheet of substrate in a horizontal posture. The second substrate transfer robot 63 (particularly, the end effector thereof) is moved within a transfer space 64 to transfer the substrate between the delivery unit 24, the single-wafer type liquid processing unit 61, and the supercritical drying unit 62. While being transferred by the second substrate transfer robot 63, the substrate W is always held in the horizontal posture.

A nitrogen gas supply 65 is configured to discharge a nitrogen gas into the transfer space 64. The nitrogen gas is supplied to the nitrogen gas supply 65 from a nitrogen gas source provided as a factory supply, for example. An exhaust unit 66 may be configured to exhaust an atmosphere within the transfer space 64 in order to accelerate a purge of the nitrogen gas in the transfer space 64. From the viewpoint of improving the purge efficiency, it is desirable to provide the nitrogen gas supply 65 and the exhaust unit 66 at positions away from each other. The nitrogen gas supply 65 schematically shown in FIG. 1 may be provided at a ceiling wall of the transfer space 64 having a rectangular parallelepiped shape. In this case, the nitrogen gas supply 65 forms a downflow of the nitrogen gas in the transfer space 64. Alternatively, the nitrogen gas supply 65 may be provided at a sidewall of the transfer space 64. In this case, the nitrogen gas supply 65 forms a side flow of the nitrogen gas in the transfer space 64.

A partition wall 67 is provided between the transfer space 64 of the processing section 6 and the delivery unit 24, and a door (not shown) having appropriate airtightness is provided at the partition wall 67. This non-illustrated door is opened only when the substrate W passes through it. With this configuration, it is possible to suppress wasteful consumption of the nitrogen gas due to a leak of the nitrogen gas from the transfer space 64 to the first transfer section 22, and, furthermore, it is also possible to suppress a leak of the nitrogen gas from the transfer space 64 to the ambient environment of the substrate processing system 1.

Figure 2:
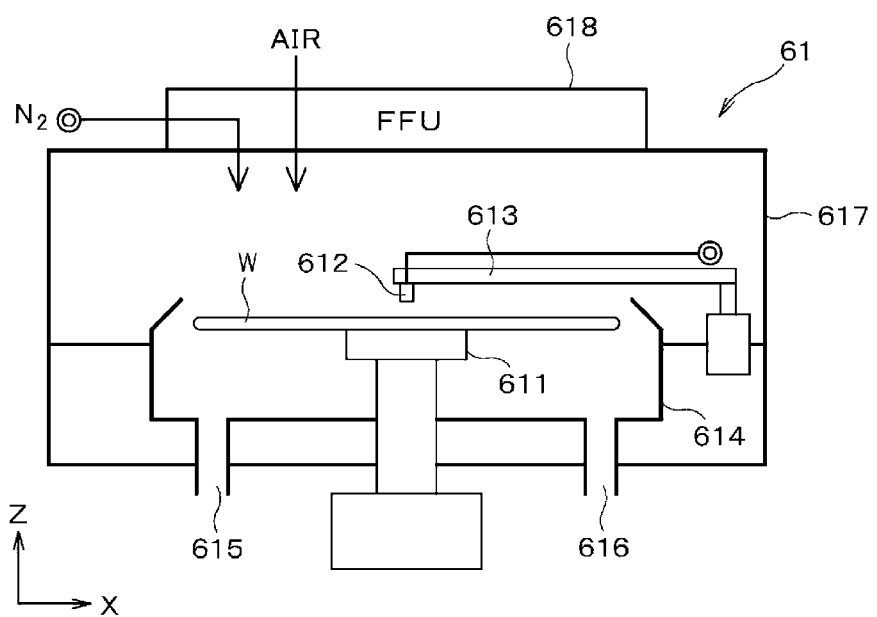
FIG. 2 is a schematic cross sectional view illustrating a configuration example of a single-wafer type liquid processing unit included in the substrate processing system of FIG. 1.

As the single-wafer type liquid processing unit 61, any one commonly known in the technical field of semiconductor manufacturing equipment may be used. A configuration example of the single-wafer type liquid processing unit 61 that can be used in the present exemplary embodiment will be briefly described below with reference to FIG. 2. The single-wafer type liquid processing unit 61 includes a spin chuck 611 capable of holding the substrate W horizontally and rotating it around a vertical axis; and one or more nozzles 612 configured to discharge a processing liquid to the substrate W held and rotated by the spin chuck 611. The nozzle 612 is supported at an arm 613 configured to move the nozzle 612. The single-wafer type liquid processing unit 61 has a liquid receiving cup 614 configured to collect the processing liquid scattered from the substrate W being rotated. The liquid receiving cup 614 has a drain port 615 through which the collected processing liquid is discharged to the outside of the liquid processing unit 61; and an exhaust port 616 through which an atmosphere within the liquid receiving cup 614 is exhausted. A clean gas is blown downwards from a fan filter unit 618 provided at a ceiling of a chamber 617 of the single-wafer type liquid processing unit 61, introduced into the liquid receiving cup 614, and exhausted through the exhaust port 616.

As the fan filter unit 618, one having a function of selectively discharging clean air or an inert gas, here, the nitrogen gas ($N_2$ gas), for example, may be used. In this case, the air in a clean room in which the substrate processing system 1 is installed is filtered by a filter (for example, a ULPA filter) in the fan filter unit 618, and this filtered air is used as the clean air. As the nitrogen gas, the one supplied from a nitrogen gas source provided as a factory supply of a semiconductor manufacturing factory is used. The fan filter unit 618 having such a function is well known in the technical field of the semiconductor manufacturing equipment, so a detailed description of its structure will be omitted here.

As the supercritical drying unit 62, any one commonly known in the technical field of the semiconductor manufacturing equipment may be used. A configuration example and an operation of the supercritical drying unit 62 that can be used in the present exemplary embodiment will be briefly described below with reference to FIG. 1 and FIG. 3. The supercritical drying unit 62 has a supercritical chamber 621; and a substrate supporting tray 622 configured to be advanced to and retreated from the supercritical chamber 621. FIG. 1 shows the substrate supporting tray 622 withdrawn from the supercritical chamber 621, and in this state, the second substrate transfer robot 63 can transfer the substrate W to the substrate supporting tray 622.

Figure 3:
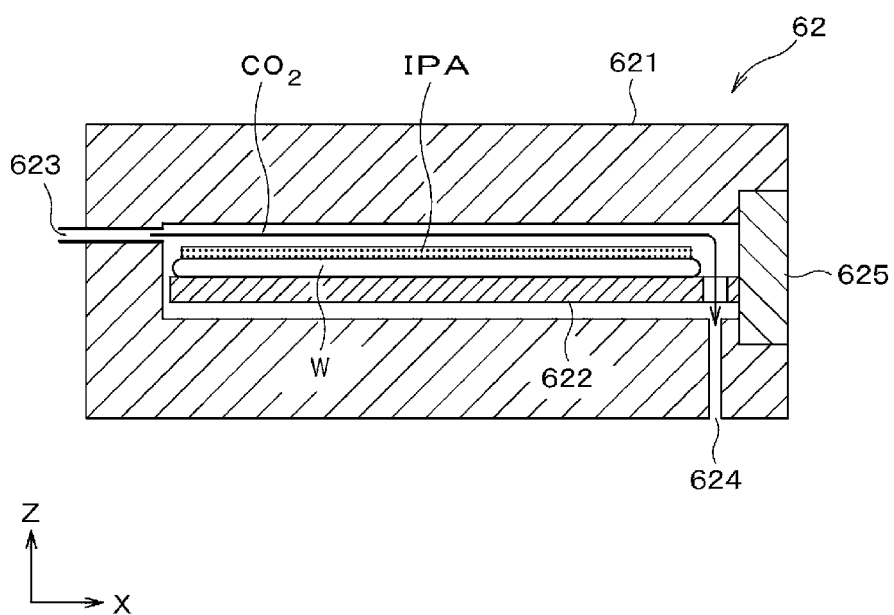
FIG. 3 is a schematic cross sectional view illustrating a configuration example of a supercritical drying unit included in the substrate processing system of FIG. 1.

FIG. 3 shows a state in which the substrate supporting tray 622 is accommodated in the supercritical chamber 621. The substrate supporting tray 622 has a lid 625. As the lid 625 closes an opening of the supercritical chamber 621 with a seal member (not shown) therebetween, a hermetically sealed processing space is formed within the supercritical chamber 621. A reference numeral 623 is a supply port 623 for a processing fluid (for example, $CO_2$ (carbon dioxide)), and a reference numeral 624 is an exhaust port for a fluid ($CO_2$, IPA, etc.).

To set a region 628 (the region where the substrate supporting tray 622 is present in FIG. 1) in the supercritical drying unit 62 where the transfer of the substrate W to the substrate supporting tray 622 is performed into a nitrogen gas atmosphere, a non-illustrated nitrogen gas discharge unit may be provided in the supercritical drying unit 62. In order to accelerate a purge of the nitrogen gas of the region 628, a non-illustrated exhaust unit configured to exhaust an atmosphere of the region 628 may be provided. From the viewpoint of improving the purge efficiency, it is desirable to provide the nitrogen gas discharge unit and the exhaust unit at positions away from each other.

Now, with reference to FIG. 4, an IPA supply mechanism 700 configured to supply IPA (isopropyl alcohol) for use in the single-wafer type liquid processing unit 61, and a configuration for degassing provided therein will be discussed.

The IPA supply mechanism 700 has a tank 702 that stores the IPA therein; and a circulation line 704 connected to the tank 702. A pump 706, a temperature controller 708, a filter 710, a flow meter 712, and a constant pressure valve 714 are provided at the circulation line 704 in sequence from the upstream side. The pump 706 is configured to form a circulating flow of the IPA in the circulation line 704 by pressing out the IPA. The temperature controller 708 is configured to control the temperature of the IPA to a temperature suitable for use in the single-wafer type liquid processing unit 61 as the supply destination of the IPA. The filter 710 is configured to remove contaminants such as particles from the IPA. The constant pressure valve 714 is configured to allow the IPA to be introduced at an appropriate pressure into the single-wafer type liquid processing unit 61 as the supply destination of the IPA.

A plurality of branch points 715 are set in the circulation line 704, and branch supply lines 716 are branched from the circulation line 704 at the individual branch points 715. A downstream end of each branch supply line 716 is connected to the nozzle 612 for IPA supply in the corresponding single-wafer type liquid processing unit 61. A dissolved gas monitor 718, a constant pressure valve 720, an opening/closing valve 722, and a dissolved gas filter (for example, a hollow fiber membrane filter) 724 are provided in the branch supply line 716 in sequence from the upstream side. At the positions of branch points 728 set in the branch supply line 716, branch return lines 730 are branched from the branch supply lines 716. Each branch return line 730 is provided with an opening/closing valve 732. These branch return lines 730 join each other to form a single return line 734, and a downstream end of the return line 734 is connected to the tank 702.

A degassing line 742 is branched off from a branch point 740 set in the circulation line 704. This degassing line 742 is provided with an inline mega sonic 744, an inline dissolved gas monitor (dissolved gas sensor) 746, a constant pressure valve 748, and a hollow fiber membrane filter 750 that are provided in sequence form the upstream side. A downstream end of the degassing line 742 is connected to the tank 702.

The inline mega sonic 744 is configured to generate cavitation bubbles by applying high-power ultrasonic waves to the IPA flowing through the degassing line 742. The inline dissolved gas monitor (dissolved gas sensor) 746 is configured to measure a concentration of gases contained in the IPA flowing through the degassing line 742, particularly, oxygen, carbon dioxide, and the like, which are harmful gases in a processing to be described later. The constant pressure valve 748 is configured to regulate a flow rate of the IPA flowing through the degassing line 742.

If the outside of the hollow fiber membrane of the hollow fiber membrane filter 750 is set into a decompressed state and the IPA is flown into the hollow fiber membrane, bubbles contained in the IPA (these bubbles are the cavitation bubbles generated by the inline mega sonic 744) and a dissolved gas contained in the IPA pass through a surface wall of the hollow fiber membrane and comes out to the outside of the hollow fiber membrane. Accordingly, the bubbles and the dissolved gas in the IPA can be reduced. It is possible to perform the degassing only with the hollow fiber membrane filter 750. However, in this degassing line 742, since the gas in the IPA is bubbled by the inline mega sonic 744 at the upstream of the hollow fiber membrane filter 750, it is possible to further increase the removing efficiency of the dissolved gas, as compared to a case where the degassing is performed only by the hollow fiber membrane filter 750. The IPA from which the dissolved gas is removed is returned to the tank 702.

Figure 4:
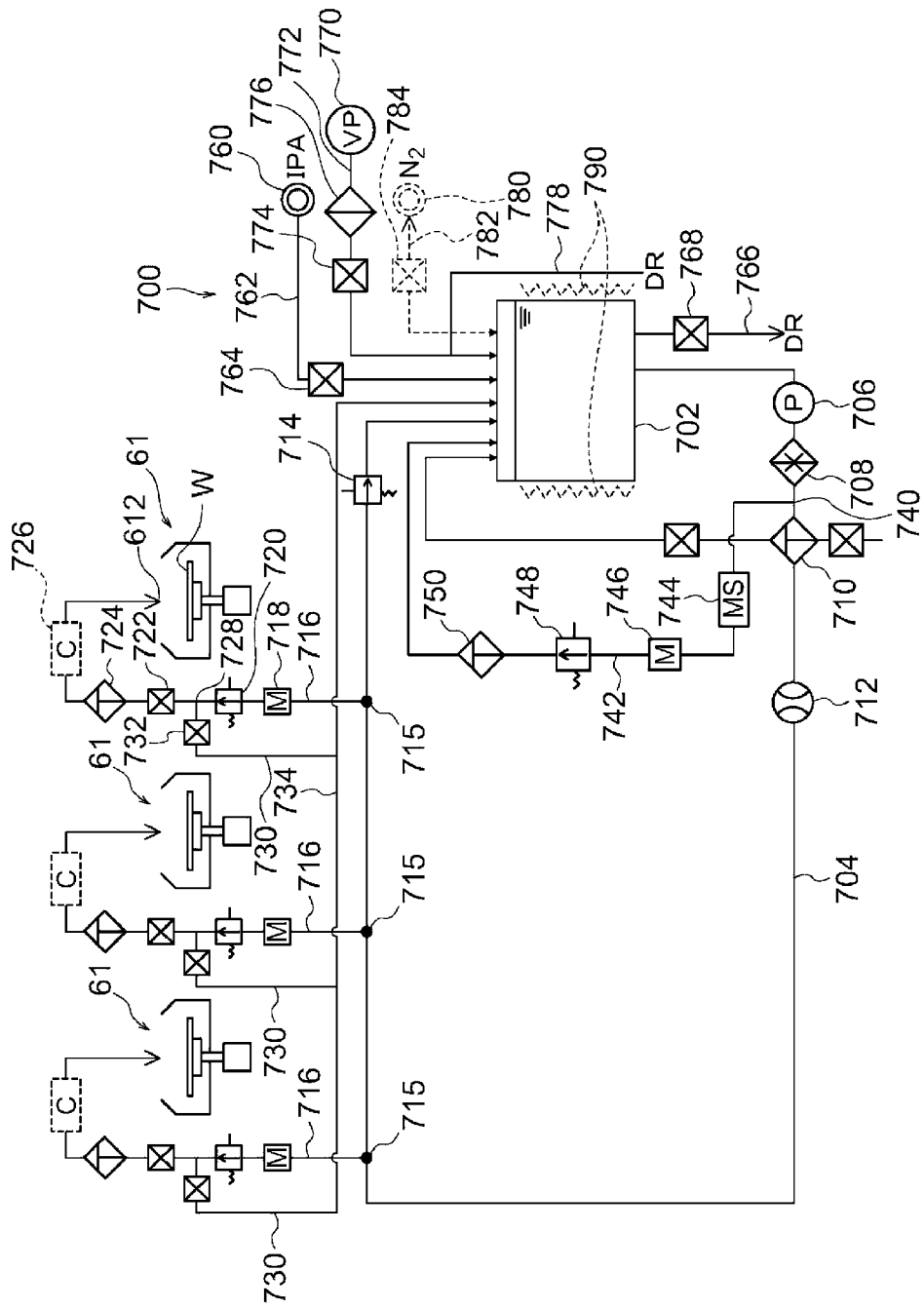
FIG. 4 is a piping diagram illustrating an IPA supply mechanism configured to supply IPA used in the single wafer type liquid processing unit of FIG. 2 and a configuration for degassing provided therein.

In the exemplary embodiment shown in FIG. 4, an inline degassing mechanism is constituted by the two inline devices: the inline mega sonic 744 and the hollow fiber membrane filter 750. Here, however, since the degassing can be performed only with the hollow fiber membrane filter 750 as mentioned, the inline degassing mechanism may be composed of the hollow fiber membrane filter 750 only. The inline degassing mechanism means a mechanism that is provided in a line (a liquid flow path such as a pipeline) and is capable of performing degassing of a liquid in a state that a liquid is flowing through that mechanism (without stopping the flow of the liquid).

The IPA is supplied to the tank 702 from an IPA source 760 via an IPA supply line 762. The IPA supply line 762 is provided with an opening/closing valve 764. In most cases, the IPA source 760 is provided as a factory supply of the semiconductor manufacturing factory in which the substrate processing system 1 is installed. A drain line 766 is connected to the tank 702, and this drain line 766 is provided with an opening/closing valve 768.

In a first configuration example of the IPA supply mechanism 700, a source 780 for an inert gas, that is, the nitrogen gas in the present exemplary embodiment is connected to the tank 702 via a gas supply line 782. An opening/closing valve 784 is connected to the gas supply line 782. In most cases, the nitrogen gas source 780 is also provided as a factory supply. In addition, the tank 702 is provided with a heater 790. Further, a cooler 726 is provided in the branch supply line 716 at the downstream of the filter 724. The components mentioned in this paragraph are drawn with broken lines or dashed lines.

In a second configuration example of the IPA supply mechanism 700, a vacuum pump (decompression device) 770 is connected to the tank 702 via a decompression line 772. This decompression line 772 is provided with an opening/closing valve 774 and a vacuum filter 776. A drain line 778 is connected to the decompression line 772.

The first configuration example and the second configuration example are different only in the above-stated parts, and the other configurations are common to both.

Now, the operation of the IPA supply mechanism 700 in the first configuration example will be described. The nitrogen gas is supplied from the nitrogen gas source 780 to the tank 702, so that the inside of the tank 702 is turned into the nitrogen gas atmosphere. Therefore, the oxygen gas and the carbon dioxide gas can be suppressed from being dissolved in the IPA. Further, if the IPA is supplied from the IPA source 760 to the tank 702 and a predetermined amount of IPA is collected in the tank 702, the pump 706 is operated, and the heater 790 provided in the tank 702 is also operated. As a result, the IPA in the tank 702 is heated to an appropriate temperature (for example, about 70° C.) below a boiling point, and the heated IPA is circulated through the circulation line 704. Furthermore, the temperature controller 708 also heats the IPA flowing through the circulation line 704 to maintain the IPA at the appropriate temperature. By heating the IPA, solubility of the gas in the IPA decreases, thus making it difficult for the gas to be dissolved in the IPA within the tank, and, also, making some of the gas already dissolved in the IPA escape from the IPA.

Some of the IPA flowing through the circulation line 704 is introduced into the degassing line 742, and is degassed by the inline mega sonic 744 and the hollow fiber membrane filter 750 through the above-described mechanism to be returned to the tank 702. Since the IPA is being heated at this time as well, the degassing efficiency is enhanced.

The IPA flowing through the circulation line 704 is introduced into at least some of the plurality of branch supply lines 716 (for example, those corresponding to the single-wafer type liquid processing units 61 whose processing start time are approaching) to be flown into the corresponding branch return lines 730 without flowing to the nozzles 612, and is then returned to tank 702 via the return lines 734.

When the above-described state continues for a while and at least the following conditions are satisfied, the controller 100 makes a determination that a state in which the IPA can be supplied to the substrate W in the single-wafer type liquid processing unit 61 (IPA supply enabled state) is created.

A gas concentration in the IPA (for example, an oxygen gas concentration and/or a carbon dioxide gas concentration) obtained by the dissolved gas monitor 746 provided in the degassing line 742 is below a predetermined threshold.

A gas concentration (for example, an oxygen gas concentration and/or a carbon dioxide gas concentration) in the IPA obtained by the dissolved gas monitor 718 corresponding to the single-wafer type liquid processing unit 61 whose processing start time is approaching is below a predetermined threshold.

As another condition, the temperature of the IPA circulating in the circulation line 704 is within a predetermined temperature range. To check the temperature of the IPA, a temperature sensor may be provided in the tank 702 or in an appropriate line connected to the tank 702.

Desirably, a processing of a single sheet of substrate W in the single-wafer type liquid processing unit 61 is started after it is confirmed that the IPA supply enabled state is created. When supplying the IPA to the substrate W, the cooler 726 is operated, the opening/closing valve 732 is closed, and the opening/closing valve 722 is opened. As a result, the IPA whose temperature has been lowered by the cooler 726 to a preset temperature (for example, ranging from a room temperature to about 30° C.) is supplied to the substrate W from the nozzle 612 for IPA supply.

Now, the operation of the IPA supply mechanism 700 in the second configuration example will be described. As in the first configuration example, if the IPA is supplied from the IPA source 760 into the tank 702 and a predetermined amount of IPA is collected in the tank 702, the inside of the tank 702 is decompressed by the vacuum pump 770 to satisfy a condition that "an internal pressure (an absolute pressure, not a gauge pressure) of the tank 702 is larger than a vapor pressure of IPA." Also, the pump 706 is operated. Since the inside of the tank 702 is decompressed, some of the gas dissolved in the IPA escapes from the IPA. The same as in the first configuration example, the IPA is circulated through the circulation line 704, and some of the IPA flowing through the circulation line 704 is introduced into the degassing line 742 to be degassed by the inline mega sonic 744 and the hollow fiber membrane filter 750 provided in the degassing line 742.

In addition, the same as in the first configuration example, the IPA flowing through the circulation line 704 is introduced into at least some of the plurality of branch supply lines 716 (for example, the single-wafer type liquid processing units 61 whose processing start time are approaching) to be flown into the corresponding branch return lines 730 without flowing to the nozzles 612, and is then returned to the tank 702 via the return lines 734. At this time, the dissolved gas concentration is monitored by the dissolved gas monitor 746 of the degassing line 742 and the dissolved gas monitor 718 of the branch supply line 716 in the same manner as in the first configuration example. When it is confirmed that the IPA supply enabled state is created, a processing of a single sheet of substrate W in the single-wafer type liquid processing unit 61 is allowed to be begun. In the second configuration example, unlike in the first configuration example, the heating of the IPA in the tank 702 and the cooling of the IPA in the branch supply line 716 are not performed.

Now, a sequence of processings of the substrate W in the substrate processing system 1 will be explained. The first substrate transfer robot 23 of the carry-in/out section 2 takes out the substrate W from the substrate transfer container C placed in the container placement section 21, and places the taken substrate W in the delivery unit 24. Next, the substrate W is taken out of the delivery unit 24 by the second substrate transfer robot 63 of the processing section 6 and carried into the single-wafer type liquid processing unit 61.

The substrate W carried into the single-wafer type liquid processing unit 61 is horizontally held by the spin chuck 611. Subsequently, the substrate W is rotated around the vertical axis by the spin chuck 611. In this state, various kinds of processing liquids necessary for the processing of the substrate W are supplied from the one or more nozzles 612 allocated to the various kinds of processing liquids, so that a liquid processing is performed on the substrate W. An example of the liquid processing will be mentioned. First, a pre-wetting process is performed by supplying a pre-wet liquid to the substrate W, and, then, a chemical liquid process (wet etching or chemical cleaning) is performed by supplying a chemical liquid to the substrate W. Next, a rinsing process is performed by supplying a rinse liquid (for example, DIW (pure water)) to the substrate W. The chemical liquid process and the rinsing process may be performed multiple times.

In the exemplary embodiment, the following processes are performed on the single sheet of substrate W, for example.

Process 1: Pre-wetting process by DIW
Process 2: DHF etching process
Process 3: DIW rinsing process
Process 4: SC1 cleaning process
Process 5: DIW rinsing process In the processes 1 to 5, DHF (dilute hydrofluoric acid) and SC1 are supplied from the different nozzles 612. The DIW may be supplied from the nozzle 612 provided exclusively for DIW supply, or may be supplied from the nozzle 612 for DHF supply, for example.

Figure 5:
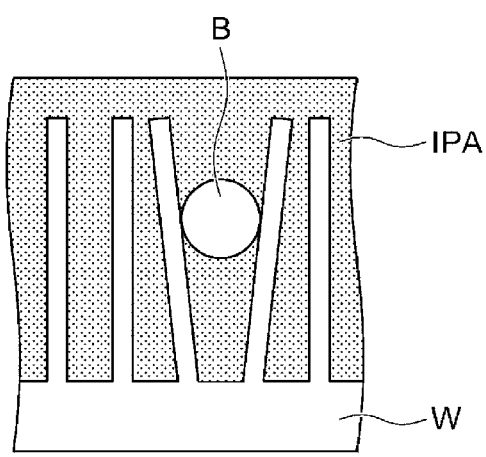
FIG. 5 is a schematic diagram illustrating a pattern collapse caused by generation of a bubble.

In the process 2, $SiO_2$ (silicon oxide) is etched by the DHF etching, and columnar bodies made of Si (silicon) and extending in a vertical direction are formed at a substantially equal pitch therebetween. The same columnar body is also shown in FIG. 5. In the exemplary embodiment, the substrate W is dried by a supercritical drying processing to be described later while suppressing a collapse of this columnar body made of Si.

After the last rinsing process (for example, after the above-described process 5), the IPA is supplied to the substrate W from the nozzle 612 for IPA discharge while carrying on the rotation of the substrate W, so that the rinse liquid on the surface of the substrate W (including a surface of a recessed portion of the pattern) is replaced with the IPA (IPA replacing process). Thereafter, in the state that the IPA is supplied from the nozzle, the rotation speed of the substrate is lowered to an extremely low level to thereby adjust a film thickness of the IPA. Then, the supply of the IPA is stopped, and the rotation of the substrate W is also stopped. As a result, the surface of the substrate W is covered with an IPA liquid film (IPA puddle) having a required film thickness (IPA puddle forming process). In the single-wafer type liquid processing unit 61, the IPA after being subjected to the above-described degassing processing is used as the IPA supplied to the substrate W in the above-described IPA replacing process and IPA puddle forming process.

In order to suppress oxygen and carbon dioxide in the air from being dissolved again in the degassed IPA, it is desirable that an atmosphere in the chamber of the single-wafer type liquid processing unit 61 is set to be an inert gas atmosphere, for example, a nitrogen gas atmosphere. For this reason, a nitrogen gas is supplied from the fan filter unit 618 having a nitrogen gas discharging function. Since the nitrogen gas has lower solubility for the IPA as compared to the oxygen gas and the carbon dioxide gas, dissolution of the gas in the IPA can be suppressed by setting the atmosphere around the substrate W to which the IPA is attached into the nitrogen gas atmosphere.

It is desirable that the atmosphere in the chamber of the single-wafer type liquid processing unit 61 is set to be the nitrogen gas atmosphere at least during a period in which the substrate W having the IPA present on the surface thereof stays in the chamber. Therefore, it is desirable that the atmosphere in the chamber is set into the nitrogen gas atmosphere by the time when the discharge of the IPA is begun, at the latest. When the substrate W is not present in the chamber and when the IPA is not attached to the surface of the substrate in the chamber, the inside of the chamber may be set to be in a clean air atmosphere having a normal atmospheric composition.

Upon the completion of the processing in the single-wafer type liquid processing unit 61, the end effector (substrate holder) of the second substrate transfer robot 63 advances into the single-wafer type liquid processing unit 61 to separate the substrate W having the IPA puddle formed thereon from the spin chuck 611, and transfers the substrate W to the supercritical drying unit 62. During the transfer of the substrate W from the single-wafer type liquid processing unit 61 to the supercritical drying unit 62, the transfer space 64 through which the substrate W passes is set in the inert gas (here, nitrogen gas) atmosphere. Therefore, even when the substrate W passes through the transfer space 64, it is possible to suppress oxygen and carbon dioxide in the air from being dissolved again in the IPA on the substrate W.

The second substrate transfer robot 63 places the substrate W carried into the supercritical drying unit 62 on the substrate supporting tray 622 of the supercritical drying unit 62. Then, the substrate supporting tray 622 is accommodated in the supercritical chamber 621, and the lid 625 formed as one body with the substrate supporting tray 622 seals the supercritical chamber 621. The inside of the housing of the supercritical drying unit 62 (that is, the inside of the region 628) is also made into an inert gas (nitrogen gas here) atmosphere. Therefore, from the time the substrate W is carried into the supercritical drying unit 62 until the substrate W is accommodated in the supercritical chamber 621 while being placed on the substrate supporting tray 622, it is possible to suppress oxygen and carbon dioxide in the air from being dissolving again in the IPA on the substrate W.

Once the substrate W is accommodated in the supercritical chamber 621, a supercritical drying processing is performed. First, a processing fluid (for example, $CO_2$) is supplied into the supercritical chamber 621 from a non-illustrated supercritical fluid source through the supply port 623, so that the supercritical chamber 621 gets filled with the $CO_2$ while the internal pressure of the supercritical chamber 621 is increased (pressure increasing process). Further, to increase the internal pressure of the supercritical chamber 621, $CO_2$ may also be supplied through another supply port (not shown) that is opened toward a bottom surface of the substrate supporting tray 622.

When the internal pressure of the supercritical chamber 621 reaches a supercritical state guaranteeing pressure (a pressure at which $CO_2$ alone and a mixed fluid of the $CO_2$ and the IPA are guaranteed to be maintained in the supercritical state), a flowing process is performed. In the flowing process, the $CO_2$ supplied from the supply port 623 flows along the surface of the substrate W over the IPA puddle, and is exhausted from the exhaust port 624 (as indicated by an arrow in FIG. 3). By continuing this state, the IPA on the surface of the substrate W gets replaced with the $CO_2$. If the IPA is replaced with the supercritical $CO_2$, the exhaust port 624 is connected to the normal pressure space, and the inside of the supercritical chamber 621 is returned to the normal pressure. As a result, the supercritical $CO_2$ on the surface of the substrate W is vaporized, so that the surface of the substrate W is dried (exhausting process). In this way, the substrate W can be dried while suppressing a collapse of the pattern formed on the surface of the substrate W.

As soon as the substrate supporting tray 622 carrying the substrate W thereon enters the supercritical chamber 621 (maintained at a relatively high temperature (e.g., about 80° C.)), the temperature of the IPA on the substrate W increases. With the rise of the temperature of the IPA, the dissolved gas in the IPA is vaporized, and bubbles are formed in the IPA. When a fine and high-aspect-ratio pattern is formed on the surface of the substrate W, in particular, when narrow and high columnar portions extending in the vertical direction are arranged at an interval therebetween and grooves are formed between the columnar portions, if large bubbles (see, for example, a notation B in FIG. 5) are formed in the IPA in the grooves, a force generated by the expansion of the bubbles may damage the columnar portions, causing a collapse of the pattern. In the present exemplary embodiment, since the degassed IPA is used, the bubbles may not be formed, and, therefore, the pattern collapse by the above-described mechanism is less likely to occur.

In addition, since the space in which the substrate W having the IPA puddle formed thereon may stay is set into the nitrogen gas atmosphere, an increase in the amount of the dissolved gas in the IPA can be suppressed during the transfer of the substrate W. For this reason, the pattern collapse by the above-described mechanism becomes more difficult to occur.

Here, the aforementioned "nitrogen gas atmosphere" does not have to be an atmosphere with a nitrogen gas concentration of 100%. The nitrogen gas concentration in this atmosphere may be of an appropriate value higher than a nitrogen gas concentration in the air.

Upon the completion of the supercritical drying processing, the dried substrate W is taken out of the supercritical drying unit 62 by the second substrate transfer robot 63, and transferred to the delivery unit 24. Next, the substrate W is taken out of the delivery unit 24 by the first substrate transfer robot 23, and accommodated in the substrate transfer container C on the container placement section 21 where it was originally stored.

According to the above-described exemplary embodiment, by using the degassed IPA as the processing liquid to be replaced with the processing fluid in the supercritical state during the supercritical drying processing, a pattern collapse can be suppressed or largely suppressed. In addition, by setting the atmosphere of the space in which the substrate with the IPA puddle is transferred into the nitrogen gas atmosphere, the pattern collapse can be suppressed more securely or can be largely suppressed.

The exemplary embodiments disclosed herein are illustrative in all aspects and do not limit the present disclosure. The above-described exemplary embodiments may be omitted, replaced and modified in various ways without departing from the scope and the spirit of the appended claims.

The substrate is not limited to the semiconductor wafer, and any of various other types of substrates used in the manufacture of semiconductor devices, such as a glass substrate and a ceramic substrate, may be used. In the above-described exemplary embodiment, although the atmosphere within the tank 702 during the degassing process and the atmosphere of the space in which the substrate W having the IPA puddle formed thereon is present or is transferred is the nitrogen gas atmosphere, the exemplary embodiment is not limited thereto, and an atmosphere of any of various other inert gases (for example, an argon gas) may be used.

According to the exemplary embodiment, it is possible to prevent or at least suppress the collapse of the pattern formed on the surface of the substrate when the supercritical drying processing is performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method, comprising:
   removing a dissolved gas in a processing liquid;
   forming a liquid film of the processing liquid covering a surface of a substrate, by supplying, onto the surface of the substrate, the processing liquid from which the dissolved gas is removed;
   carrying the substrate having the liquid film formed thereon into a processing vessel; and
   drying the surface of the substrate by flowing a processing fluid into the processing vessel while maintaining an internal pressure of the processing vessel, in which the substrate having the liquid film formed thereon is accommodated, at a pressure allowing the processing fluid to be maintained in a supercritical state, to replace the processing liquid covering the surface of the substrate with the processing fluid, and, then, by vaporizing the processing fluid.

2. The substrate processing method of claim 1,
   wherein the removing of the dissolved gas comprises heating the processing liquid to a temperature less than a boiling temperature of the processing liquid.

3. The substrate processing method of claim 2,
   wherein the removing of the dissolved gas comprises heating the processing liquid stored in a vessel to the temperature less than the boiling temperature of the processing liquid, while maintaining an inside of the vessel in which the processing liquid is stored in an atmosphere of an inert gas.

4. The substrate processing method of claim 3,
   wherein the inert gas is a nitrogen gas or an argon gas.

5. The substrate processing method of claim 1,
   wherein the removing of the dissolved gas comprises decompressing a vessel in which the processing liquid is stored.

6. The substrate processing method of claim 1,
   wherein the removing of the dissolved gas comprises:
   generating a bubble in the processing liquid by applying ultrasonic vibrations to the processing liquid; and
   removing the bubble from the processing liquid.

7. The substrate processing method of claim 6,
   wherein the generating of the bubble in the processing liquid and the removing of the bubble from the processing liquid are performed by using an inline degassing mechanism provided in a circulation path connected to a vessel in which the processing liquid is stored, while flowing the processing liquid into the circulation path.

8. The substrate processing method of claim 1, further comprising:
   maintaining an atmosphere of a space through which the substrate having the liquid film of the processing liquid formed thereon passes to an atmosphere of an inert gas during a period from an end of the forming of the liquid film to an end of the carrying of the substrate into the processing vessel.

9. The substrate processing method of claim 8,
   wherein the inert gas is a nitrogen gas or an argon gas.

10. The substrate processing method of claim 1, further comprising:
performing a chemical liquid processing on the substrate prior to the forming of the liquid film.

11. The substrate processing method of claim 10, wherein the chemical liquid processing is an etching processing.

12. The substrate processing method of claim 11, wherein a pattern having multiple grooves is formed on the substrate by the etching processing.

13. A substrate processing system, comprising:
a liquid processing unit configured to perform a liquid film forming process on a substrate;
a processing liquid supplying mechanism configured to supply a processing liquid used in the liquid processing unit, the processing liquid supplying mechanism including a degassing device configured to remove a dissolved gas from the processing liquid;
a supercritical drying unit configured to perform a supercritical drying processing on the substrate;
a transfer device configured to transfer the substrate from the liquid processing unit to the supercritical drying unit; and
a controller configured to control an operation of the substrate processing system to perform a substrate processing method as claimed in claim 1.

* * * * *